(12) United States Patent
Liu

(10) Patent No.: US 7,471,118 B2
(45) Date of Patent: Dec. 30, 2008

(54) SQUELCH DETECTION SYSTEM FOR HIGH SPEED DATA LINKS

(75) Inventor: Chunbo Liu, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 45 days.

(21) Appl. No.: 11/747,246

(22) Filed: May 11, 2007

(65) Prior Publication Data
US 2008/0278227 A1    Nov. 13, 2008

(51) Int. Cl.
*G01R 19/00* (2006.01)
*H03K 5/153* (2006.01)

(52) U.S. Cl. .............................. 327/58; 327/77; 327/81; 327/89

(58) Field of Classification Search .................. 327/58, 327/62, 63, 65, 67–81
See application file for complete search history.

(56) References Cited

U.S. PATENT DOCUMENTS 7,157,944 B1 * 1/2007 Wang et al. ................... 327/58

* cited by examiner

*Primary Examiner*—Tuan T. Lam
*Assistant Examiner*—Daniel Rojas
(74) *Attorney, Agent, or Firm*—Christopher P. Maiorana, PC

(57) ABSTRACT

An apparatus comprising a first comparator circuit, a second comparator circuit, a third comparator circuit, and a difference circuit. The first comparator circuit may be configured to generate a first intermediate current in response to a first input voltage and a second input voltage. The second comparator circuit may be configured to generate a second intermediate current in response to the first input voltage and the second input voltage. The third comparator circuit may be configured to generate an intermediate reference current in response to a first reference voltage and a second reference voltage. The difference circuit may be configured to generate a first compare voltage and a second compare voltage in response to the first intermediate current, the second intermediate current, and the intermediate reference current. The apparatus may indicate a squelch condition when the first compare voltage is greater than the second compare voltage.

15 Claims, 3 Drawing Sheets

SQUELCH DETECTION SYSTEM FOR HIGH SPEED DATA LINKS

FIELD OF THE INVENTION

The present invention relates to high speed data links generally and, more particularly, to a method and/or apparatus for implementing a squelch detection circuit for high speed data links.

BACKGROUND OF THE INVENTION

In USB2.0 and other high speed data links, a high speed receiver needs to detect a squelch condition when a differential voltage level on the data bus falls below a low threshold. A non-squelch also needs to be detected when the differential voltage level is above a high threshold. In USB2.0, the high threshold is 150 mV, and the low threshold 100 mV. Squelch detection is needed to determine whether the data transmitted on the bus is noise or is a valid signal.

It would be desirable to implement a circuit that performs squelch detection that may be suitable for a USB2.0, Firewire, Serial ATA, or other high speed bus environment.

SUMMARY OF THE INVENTION

The present invention concerns an apparatus comprising a first comparator circuit, a second comparator circuit, a third comparator circuit, and a difference circuit. The first comparator circuit may be configured to generate a first intermediate current in response to a first input voltage and a second input voltage. The second comparator circuit may be configured to generate a second intermediate current in response to the first input voltage and the second input voltage. The third comparator circuit may be configured to generate an intermediate reference current in response to a first reference voltage and a second reference voltage. The difference circuit may be configured to generate a first compare voltage and a second compare voltage in response to the first intermediate current, the second intermediate current, and the intermediate reference current. The apparatus may indicate a squelch condition when the first compare voltage is greater than the second compare voltage.

The objects, features and advantages of the present invention include providing a system for implementing squelch detection that may (i) operate on high speed data lines, (ii) be suitable for a USB2.0 environment, (iii) be suitable for a variety of high speed data busses, and/or (iv) be implemented with a minimal amount of die area.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
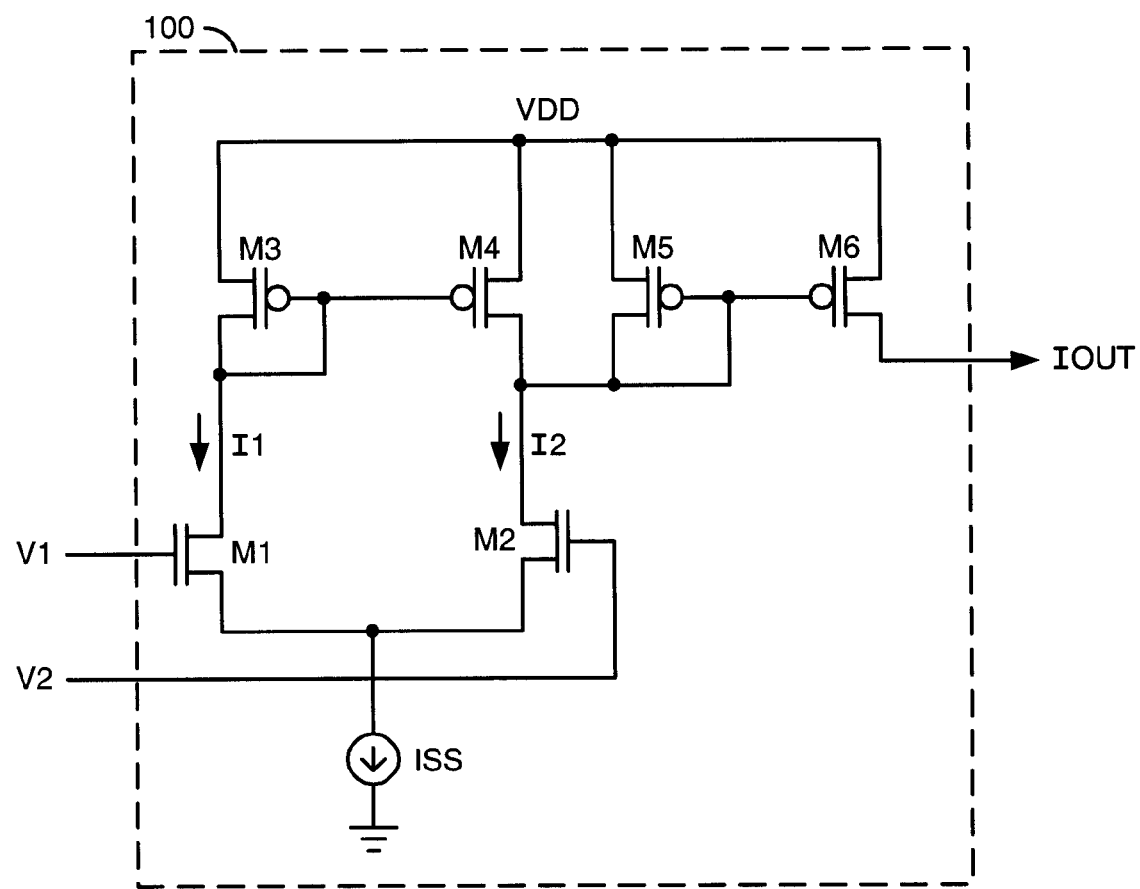
FIG. 1 is a diagram of a difference circuit in accordance with an embodiment of the present invention.

Referring to FIG. 1, a block diagram of a detection circuit 100 is shown in accordance with a preferred embodiment of the present invention. The detection circuit 100 generally comprises a transistor M1, a transistor M2, a transistor M3, a transistor M4, a transistor M5 and a transistor M6. The transistor M1 may receive a first half of a differential input signal (e.g., V1). The transistor M2 may receive a second half of a differential input signal (e.g., V2). The transistor M3 may present a current (e.g., I1). The transistor M4 may generate a current (e.g., I2). The transistor M5 may be connected between a supply voltage (e.g., VDD) and the transistor M2. The transistor M6 may have a source connected to the supply voltage VDD. A drain of the transistor M6 may present an output current (e.g., Iout). In one example, the transistors M1-M6 may be implemented as MOSFET transistors. The transistors M1 and M2 may be implemented as n-channel devices. The transistors M3-M6 may be implemented as p-channel devices. However, other transistor types (e.g., bipolar, JFET, etc.) and/or polarities may be implemented to meet the design criteria of a particular implementation.

The circuit 100 may present the current Iout as a function of the differential input voltages V1 and V2. For example, the output current Iout may be defined as:

$$I_{out} = I_2 - I_1 = \beta V_{21} \sqrt{\frac{2I_{ss}}{\beta} - V_{21}^2} \text{ if } V_2 > V_1$$

and $I_{out} = 0$ if $V_2 \leq V_1$, where $V_{21}$ is the differential input voltage, and $\beta$ is the current gain of the input transistors M1 and M2.

Figure 2:
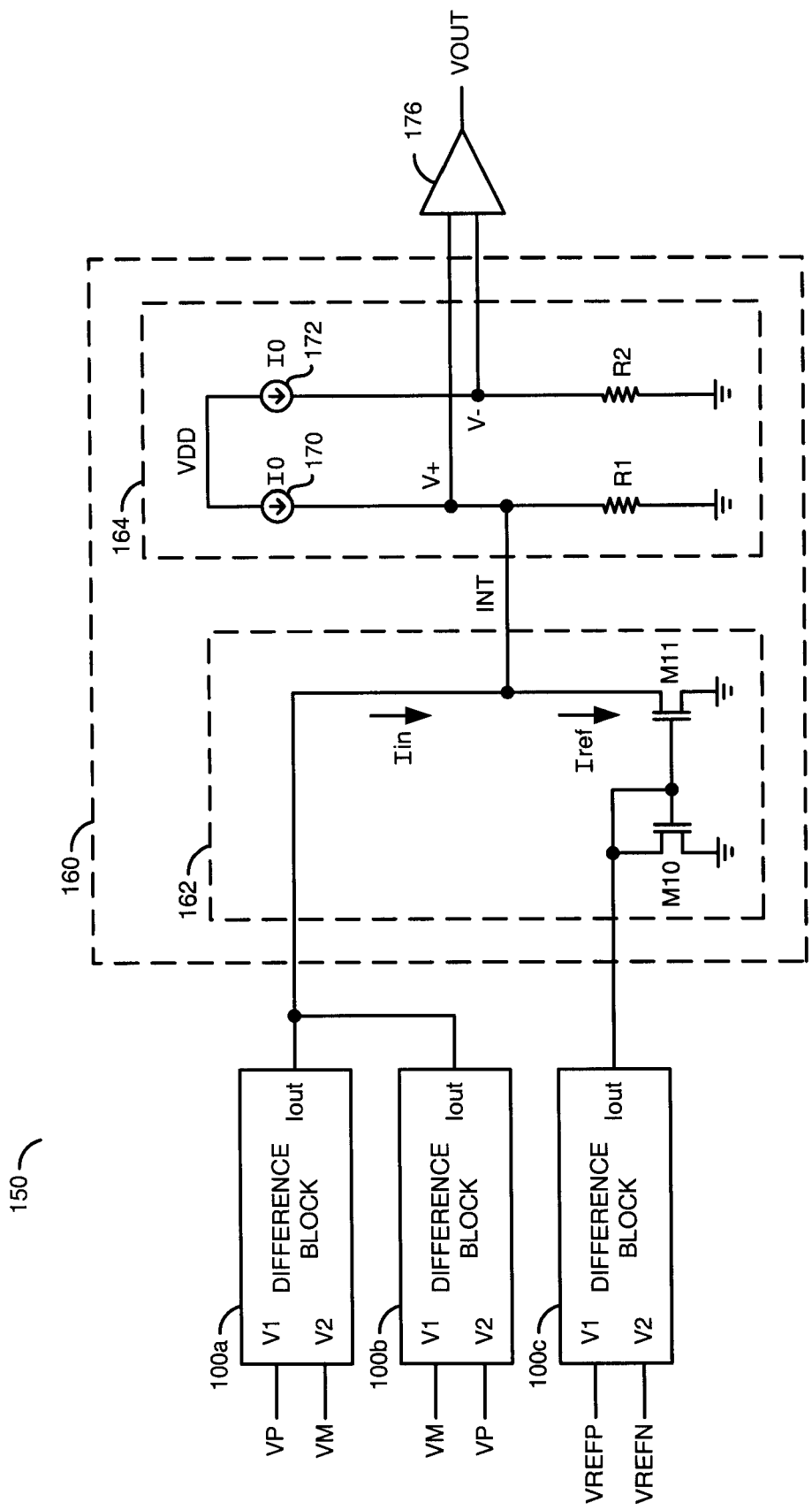
FIG. 2 is a diagram of a squelch detection circuit in accordance with the present invention.

Referring to FIG. 2, a circuit 150 is shown. The circuit 150 may be implemented as a squelch detection circuit that implements a number of the difference circuits 100a-100n. The difference circuits 100a-100n may be implemented similarly to the circuit 100 of FIG. 2. A voltage (e.g., VP) may be presented to the input V1 and a voltage (e.g., VM) may be presented to the input V2. The input V1 and the input V2 may be referred to as inputs, while the voltage VP and the voltage VM may be referred to as signals. However, the terms input and signal may be used interchangeably. The voltage VP and the voltage VM may be input voltages received from a data bus (to be described in more detail in connection with FIG. 3). In one example, the data bus may be a Universal Serial Bus. However, other buses (e.g., Firewire, SATA, etc.) may be implemented to meet the design criteria of a particular implementation. The difference circuits 102a and 102b may have a similar implementation but with the input VP and the input VM being swapped.

The circuit 150 may also include a difference circuit 160. The difference circuit 160 generally comprises a first portion 162 and a second portion 162. The first portion 162 generally comprises a transistor M10 and a transistor M11. The output of the difference circuit 100c may be presented to the gate of the transistor M10, to the gate of the transistor M11, and to the source of the transistor M11. The drain of the transistor M10 and the drain of the transistor M11 are normally connected to ground. A current Iref is shown flowing through the transistor M11. The difference circuit 10a and the difference circuit 100b normally combine to generate a current Iin. The circuit 162 presents a current (e.g., INT) to the circuit 164. In one example, the transistors M10 and M11 may be implemented as p-channel MOSFET transistors. The current sources 170 and 172 may also be implemented as p-channel MOSFET transistors. However, other transistor types (e.g., bipolar, JFET, etc.) and/or polarities may be implemented to meet the design criteria of a particular implementation.

The circuit 164 generally comprises a current source 170, a current source 172, a resistor R1 and a resistor R2. The current source 170 and the current source 172 are normally connected to the supply voltage VDD. The current source 170, along with the resistor R1, normally generate a voltage (e.g., V+). The current source 172, along with the resistor R2, normally generate a voltage (e.g., V−).

The voltage V+ and the voltage V− may be compare voltages that may be presented to a circuit 176. The circuit 176 may be a comparator circuit that may generate a voltage (e.g., VOUT). The voltage VOUT may be an output voltage that normally indicates whether a squelch condition has occurred.

The current Iin may be defined as:

$$I_{in} = \beta|V_{12}|\sqrt{\frac{2I_{ss}}{\beta} - |V_{12}|^2}$$

The current Iin is normally a function of the absolute value of the input differential voltage (e.g., between the voltage VP and the voltage VM).

The difference block 100c may be used to generate the reference current Iref. The input signals VREFP and VREFN presented to the difference block 100c are normally two reference voltages that satisfy the following equation $$V_{refp} - V_{refn} + V\text{threshold}$$

In the example of a USB 2.0 implementation, the signal Vthreshold is normally implemented as a 125 mV. However, for other implementations, such as a Firewire implementation, or an SATA implementation, other voltages may be used as the signal Vthreshold. In FIG. 2, the two input signals V+ and V− present to the comparator 176 may be defined as:

$$V+ = (I_{in} - I_{ref} + I_0)R$$

$$V- = +I_0 R$$

So if $|V_{12}|$ is greater than the voltage Vthreshold, then V+>V−, and, Vout is high. If $|V_{12}|$ is less than the voltage Vthreshold, then V+<V−, and Vout is low. The output signal VOUT of the comparator 176 normally indicates whether the input differential voltage is above or below the squelch threshold voltage Vthreshold.

The difference blocks 100a and 100b may be used to generate the current Iin that is normally proportional to the absolute value of the differential input voltage (e.g., between the voltage VP and the voltage VM). The difference block 100c normally generates a current proportional to the difference between the two preset reference voltages (e.g., VREFP and VREFN). When the absolute value of the differential input voltage is larger than the preset voltage difference, the current Iin is larger than the current Iref, which pushes the node V+ above the node V−. The output of the comparator 176 pushes the voltage VOUT high, indicating that valid data has been detected. If the input differential voltage is less than the preset voltage difference, the current Iin is less than the current Iref, and the node V+ is pulled below V−, and the voltage VOUT is low, indicating that no data has been detected.

Figure 3:
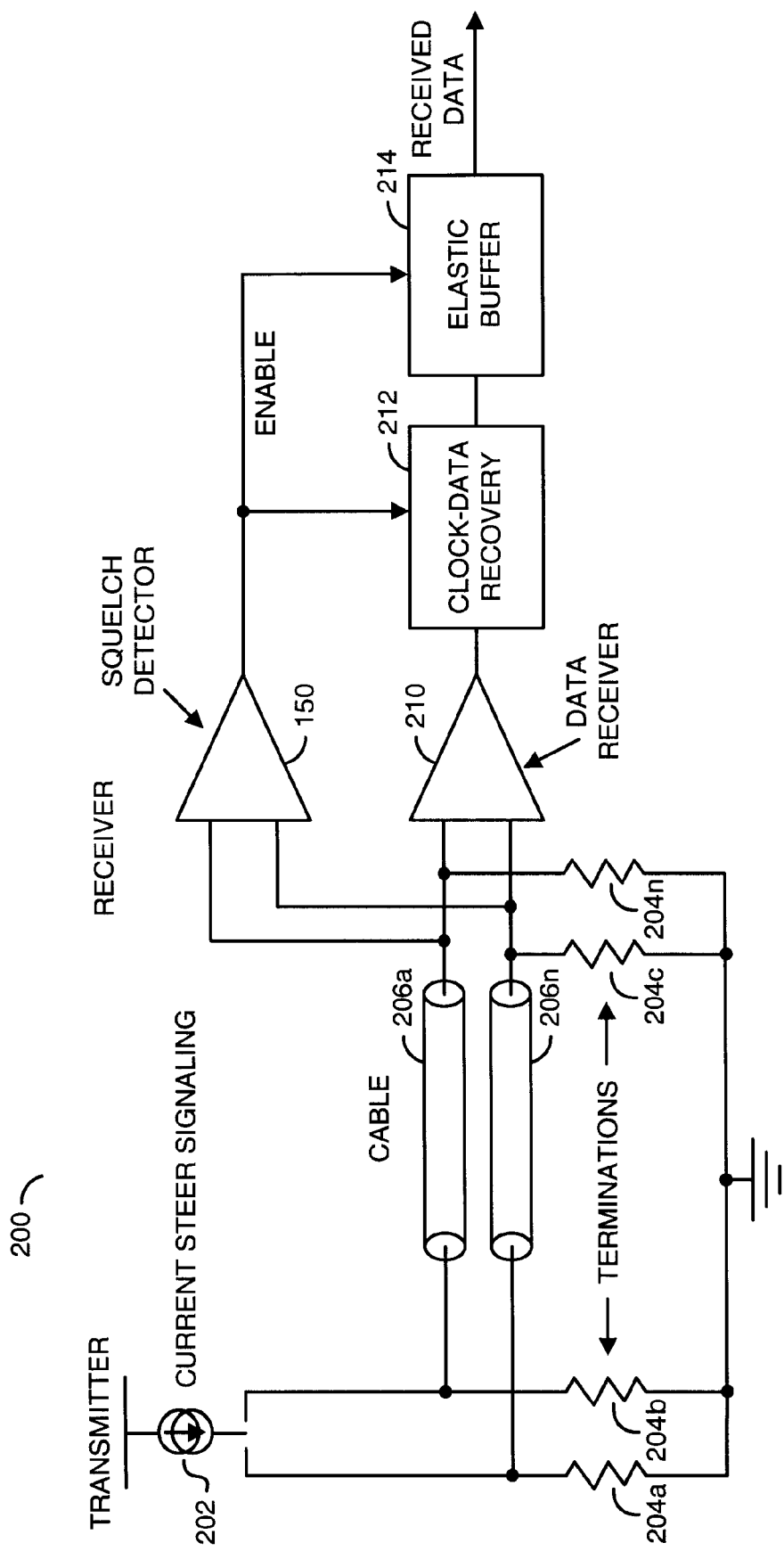
FIG. 3 is a diagram illustrating a high speed transceiver system illustrating the present invention.

Referring to FIG. 3, a system 200 is shown illustrating a high speed transceiver system. The system 200 generally comprises a current steering circuit 202, a number of terminating resistors 204a-204n, a pair of cables 206a and 206n, the squelch detector circuit 150, a data receiver circuit 210, a circuit 212 and a circuit 214. The circuit 212 may be implemented, in one example, as a clock-data recovery circuit. The signal 214 may be implemented as an elastic buffer. Data may be transmitted by steering the constant current 202 into the termination resistors 204a-204c. The data receiver 210 and the squelch detector 150 may implement a front end of a receiver. The squelch detector circuit 150 normally determines if data is present instead of noise on the data lines 206a and 206n. The squelch detector 154 presents a signal (e.g., ENABLE) to the downstream blocks 212 and 214 in the receiver 200.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first comparator circuit configured to generate a first intermediate current in response to a first input voltage and a second input voltage;
   a second comparator circuit configured to generate a second intermediate current in response to said first input voltage and said second input voltage;
   a third comparator circuit configured to generate an intermediate reference current in response to a first reference voltage and a second reference voltage;
   a difference circuit configured to generate a first compare voltage and a second compare voltage in response to said first intermediate current, said second intermediate current, and said intermediate reference current, wherein said apparatus indicates a squelch condition when said first compare voltage is greater than said second compare voltage.

2. The apparatus according to claim 1, wherein said apparatus is implemented in a Universal Serial Bus system.

3. The apparatus according to claim 1, wherein said first comparator circuit, said second comparator circuit, and said third comparator circuit are implemented as similar difference circuits.

4. The apparatus according to claim 1, wherein said first comparator and said second comparator each have a first input and a second input, wherein (i) said first input of said first comparator and said second input of said second comparator receive said first input voltage and (ii) said second input of said first comparator and said first input of said second comparator receive said second voltage input.

5. The apparatus according to claim 1, wherein said difference circuit comprises: a first portion comprising a first transistor and a second transistor connected to said intermediate reference current, wherein said first portion present an intermediate voltage; and a second portion comprising a first and a second current source wherein said second portion is configured to generate a differential output signal comprising said first compare voltage and a second compare voltage.

6. The apparatus according to claim 1, wherein said apparatus is implemented in a Firewire system.

7. The apparatus according to claim 1, wherein said apparatus is implemented in a Serial ATA system.

8. The apparatus according to claim 1, wherein said apparatus is implemented in a high speed data bus system.

9. An apparatus comprising:
   means for generating a first intermediate current in response to a first input voltage and a second input voltage;

means for generating a second intermediate current in response to said first input voltage and said second input voltage;

means for generating an intermediate reference current in response to a first reference voltage and a second reference voltage;

means for generating a first compare voltage and a second compare voltage in response to said first intermediate current, said second intermediate current, and said intermediate reference current, wherein said apparatus indicates a squelch condition when said first compare voltage is greater than said second compare voltage.

10. A method for squelch detection on a high speed data bus, comprising the steps of:

(A) generating a first intermediate current in response to a first input voltage and a second input voltage;

(B) generating a second intermediate current in response to said first input voltage and said second input voltage;

(C) generating an intermediate reference current in response to a first reference voltage and a second reference voltage;

(D) generating a first compare voltage and a second compare voltage in response to said first intermediate current, said second intermediate current, and said intermediate reference current, wherein said method indicates a squelch condition when said first compare voltage is greater than said second compare voltage.

11. The method according to claim 10, wherein said method is implemented in a Universal Serial Bus system.

12. The method according to claim 10, wherein said method is implemented in a Firewire system.

13. The method according to claim 10, wherein said method is implemented in a Serial ATA system.

14. The method according to claim 10, wherein said method is implemented in a high speed data bus system.

15. The method according to claim 10, wherein steps (A), (B) and (C) are implemented using similar difference circuits.

* * * * *